US005800924A

United States Patent [19]

Metter

[11] Patent Number: 5,800,924
[45] Date of Patent: *Sep. 1, 1998

[54] HIGH PURITY COMPOSITE USEFUL AS FURNACE COMPONENTS

[75] Inventor: Robert Howard Metter, Orange, Calif.

[73] Assignee: SGL Carbon Composites, Inc., Gardena, Calif.1

[*] Notice: The term of this patent shall not extend beyond the expiration date of Pat. No. 5,683,281.

[21] Appl. No.: 829,345

[22] Filed: Mar. 31, 1997

Related U.S. Application Data

[62] Division of Ser. No. 394,605, Feb. 27, 1995, Pat. No. 5,683,281.

[51] Int. Cl.$^6$ ................................................. B32B 9/00
[52] U.S. Cl. ..................... 428/408; 442/179; 117/13; 117/208
[58] Field of Search .................. 428/408; 442/179; 117/13, 208

[56] References Cited

U.S. PATENT DOCUMENTS

| | | | |
|---|---|---|---|
| 3,174,895 | 3/1965 | Gibson et al. | 161/259 |
| 3,462,289 | 8/1969 | Rohl et al. | 117/46 |
| 4,119,189 | 10/1978 | Ehrenreich | 192/107 |
| 4,178,413 | 12/1979 | DeMunda | 428/408 |
| 4,275,095 | 6/1981 | Warren . | |
| 4,397,901 | 8/1983 | Warren | 428/101 |
| 4,425,407 | 1/1984 | Galasso et al. | 428/368 |
| 4,465,777 | 8/1984 | Shuford | 501/88 |
| 4,472,476 | 9/1984 | Veltri et al. | 428/215 |
| 4,476,164 | 10/1984 | Veltri et al. . | |
| 4,476,178 | 10/1984 | Veltri et al. | 428/215 |
| 4,487,799 | 12/1984 | Galasso et al. | 428/334 |
| 4,500,602 | 2/1985 | Patten et al. | 428/408 |
| 4,507,272 | 3/1985 | Mullen et al. . | |
| 4,515,860 | 5/1985 | Holzl | 428/408 |
| 4,585,675 | 4/1986 | Shuford | 427/376.2 |
| 4,599,256 | 7/1986 | Vasilos | 428/114 |
| 4,671,997 | 6/1987 | Glasso et al. | 428/408 |
| 4,684,021 | 8/1987 | Niebling et al. | 206/334 |
| 4,795,677 | 1/1989 | Gray | 428/246 |
| 4,833,030 | 5/1989 | Petersen | 428/408 |
| 4,863,773 | 9/1989 | Rousseau et al. | 428/68 |
| 4,868,056 | 9/1989 | Haselkorn | 428/408 |
| 4,894,286 | 1/1990 | Gray | 428/408 |
| 4,998,879 | 3/1991 | Foster et al. | 432/253 |
| 5,132,145 | 7/1992 | Valentian | 427/249 |
| 5,207,992 | 5/1993 | Matsuo et al. | 442/249 |
| 5,616,175 | 4/1997 | Walsh | 117/14 |

FOREIGN PATENT DOCUMENTS

| | | |
|---|---|---|
| 290322 A1 | 11/1988 | European Pat. Off. ........ C30B 11/00 |
| 2240884 | 10/1974 | Germany . |
| 3327659A1 | 2/1985 | Germany . |
| 3328313 | 2/1985 | Germany . |
| 3820714 | 1/1990 | Germany . |
| 63-66063 | 3/1988 | Japan . |
| 63-112464 | 5/1988 | Japan . |
| 1264964A | 10/1989 | Japan . |
| 2197618 | 5/1988 | United Kingdom . |
| WO 91/17839 | 11/1991 | WIPO . |

OTHER PUBLICATIONS

*Ceramic Coatings for Carbon–Carbon Composites* by James R. Strife and James E. Sheehan, Ceramic Bulletin, vol. 67, No. 2 1988, pp. 236–274.

Brochure *Product for The Semiconductor Industry* Obtained by Applicant in May 1990. Ringsdorff—no date.

Brochure *Schunk Graphite Technology*, Schunk, 1–90 and 6–90.

Brochure *Fabmate Cage Boats*, Poco Graphite, Inc. Oct. 1989.

*Primary Examiner*—Christopher Raimund
*Attorney, Agent, or Firm*—Renner, Kenner, Greive, Bobak, Taylor & Weber

[57] ABSTRACT

A Czochralski process furnace component is disclosed. The component comprises a high purity, semiconductor standard composite including a carbon fiber reinforced carbon matrix having a level of metal impurity below the detection limit of inductively coupled plasma spectroscopy. A process for producing the components includes heat treatment of the carbon fiber and the components.

54 Claims, 6 Drawing Sheets

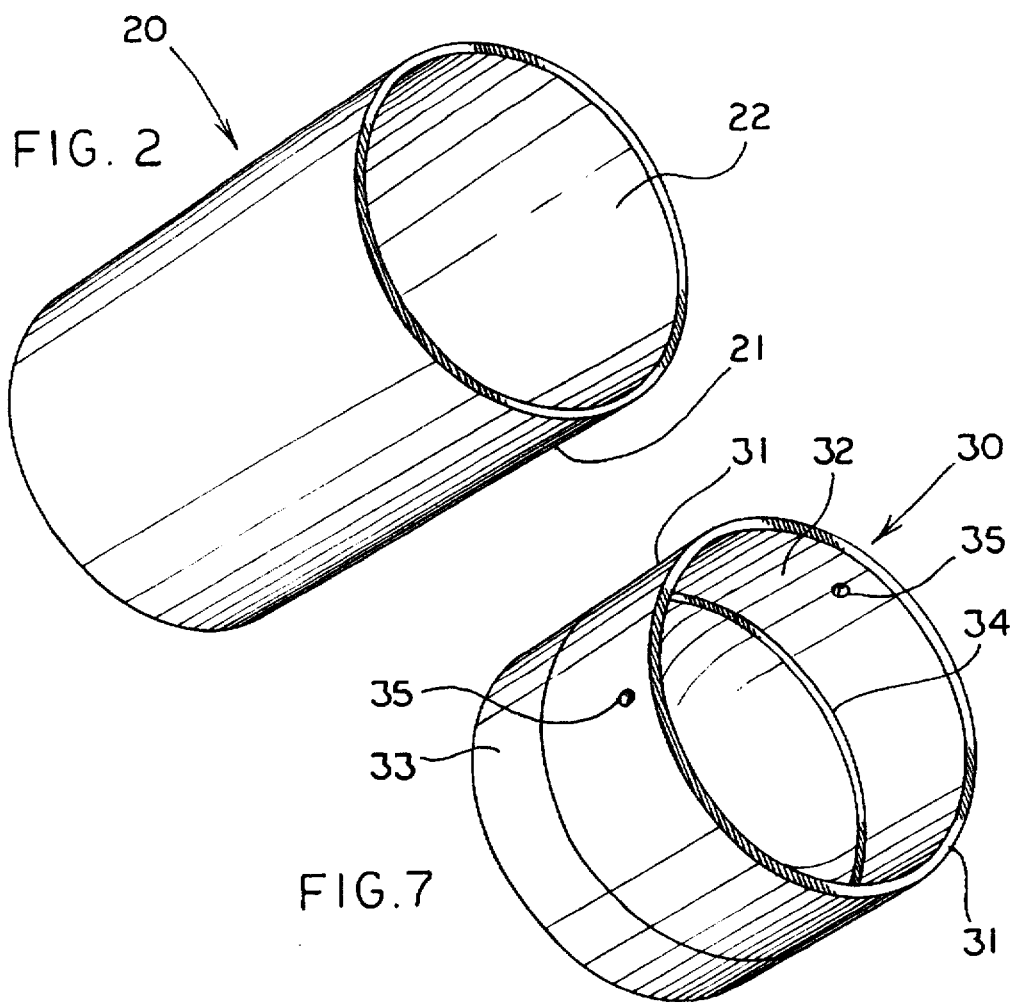
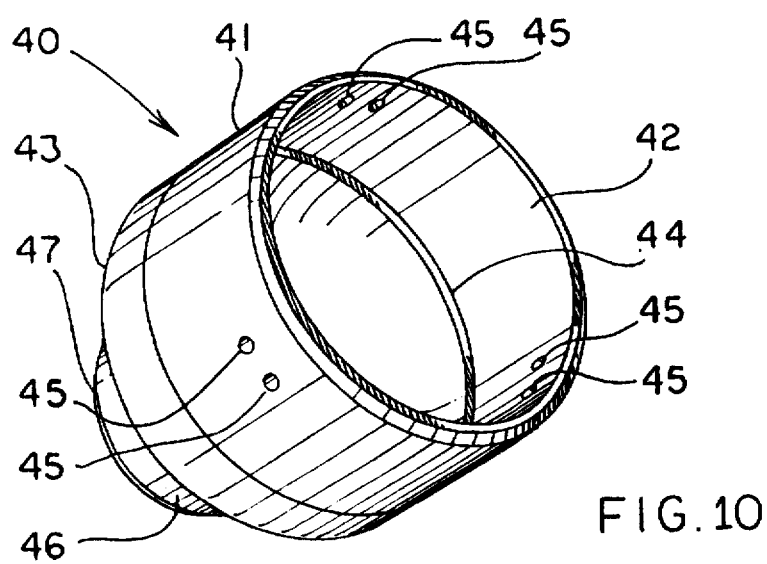

HIGH PURITY COMPOSITE USEFUL AS FURNACE COMPONENTS

This is a divisional of application Ser. No. 08/394,605filed on Feb. 27, 1995now U.S. Pat. No. 5,683,281.

TECHNICAL FIELD

The present invention is directed to high purity composites of carbon fiber within a carbon matrix and their preparation. More particularly, the present invention is directed to high purity composites useful as semiconductor material processing components, such as Czochralski furnace components and furniture.

BACKGROUND OF THE INVENTION

Silicon wafers for use in the semiconductor industry are produced by a variety of methods. One of the methods is that referred to as the Czochralski or "CZ" technique. In the CZ technique a seed crystal of known orientation is immersed in a molten pool of silicon. This triggers solidification and precipitation of the silicon. As the crystal is mechanically pulled upwardly from the pool, the orientation of the solidifying front mimics that of the seed crystal. Silicon wafers can be manufactured from the solid ingot by machining and polishing.

Specifically constructed furnaces are used to accurately control the various parameters needed to ensure that high quality crystals are produced. Several of the key components in CZ crystal growing furnaces are made from graphite. These include various liners, shields, tubes, crucible susceptors and the like. Graphite has been the material conventionally utilized in such processes due to its high temperature capability and relative chemical inertness.

Disadvantages of graphite include its poor durability brought about by its highly brittle nature and its tendency to microcrack when exposed to repeated temperature cycles. Such microcracking alters the thermal conductivity of the component which in turn makes accurate temperature control of the silicon melt difficult. In addition, contamination of the silicon melt may occur by the leaching of impurities from the graphite components or from particulates generated by the degradation of the graphite itself. Semiconductor standards require extremely low levels of impurities in the semiconductor processing system, to allow substantially no impurities to be incorporated into the semiconductor material, as even trace amounts can alter the electronic properties of the semiconductor material.

Further, the deposition of oxides of silicon on graphite parts during the production of the silicon crystal occurs to such an extent that parts must be cleaned on a regular basis and replaced periodically. Replacing worn graphite parts is a time consuming and costly process.

Therefore, there has been a need for the manufacture of components for CZ crystal growing reactors that have the advantages of graphite without the disadvantages. Such components would enable the more cost effective production of high quality silicon semiconductor wafers.

There have been attempts made to utilize carbon/carbon composites in similar electronic material production processes, in place of graphite furnace components and furniture. U.S. Pat. No. 5,132,145 and corresponding European Patent application 88401031.5 to Valentian disclose a method of making a composite material crucible for use in the Bridgman method for producing single crystals of metallic material semiconductors.

Valentian proposed making a cylindrical crucible for holding a molten sample, from a single wall of carbon fibers or silicon carbide fibers impregnated with carbon or silicon carbide, and depositing on the inner wall of the crucible, a thin inner lining of silicon carbide in combination with silica, silicon nitride, and silicon nitride/alumina, or in other embodiments, amorphous carbon, boron nitride, titanium nitride or diboride, and zirconium nitride or diboride. The thin inner lining is required to avoid contamination of the molten sample, to provide a matched thermal conductivity with the molten sample, and to avoid crack propagation which is a drawback of the bulk material.

It is therefore an object of the present invention to provide components for use in semiconductor processing that are superior in mechanical and thermal properties to conventional graphite components.

It is a further object of the present invention to provide components for use in semiconductor processing that are superior in purity characteristics to conventional graphite components and to conventional carbon/carbon materials.

SUMMARY OF THE INVENTION

The present invention provides a high purity carbon/carbon composite material consisting of carbon fiber reinforcements within a carbon matrix. This material has outstanding thermal capabilities, especially in non-oxidizing atmospheres. Before the present invention, use of carbon/carbon composite materials in the electronics industry was largely restricted due to the inability to produce materials that not only exhibit good mechanical properties at high temperature but that are extremely pure and will not contaminate sensitive electronic production articles such as semiconductor materials or devices, and silicon wafers in particular.

The present invention therefore provides a high purity, semiconductor standard composite comprising a carbon fiber reinforced carbon matrix having a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn.

The present invention further provides semiconductor processing, such as Czochralski crystal growing, furnace components and furniture comprising the above high purity, carbon/carbon composite, the composite including a carbon fiber reinforced carbon matrix having a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn. In one embodiment, the present invention provides a semiconductor processing furnace heat shield or furnace tube liner comprising the high purity, semiconductor standard composite. In another embodiment, the present invention provides a Czochralski process crucible susceptor comprising the high purity, semiconductor standard composite.

The present invention also provides a semiconductor crystal growing apparatus comprising at least one high purity, carbon/carbon composite components, said composite including a carbon fiber reinforced carbon matrix having a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn.

According to the present invention, therefore, there is provided a Czochralski crystal growing process for pulling a semiconductor ingot from a semiconductor material melt, such as a silicon ingot from a silicon melt, including providing the semiconductor material (such as silicon) melt in a quartz crucible, wherein the quartz crucible is isolated from contaminant sources by at least one high purity, carbon/carbon composite component. In one embodiment, the process includes intimately supporting the crucible with the above susceptor. In another embodiment, the process includes disposing the furnace heat shield or furnace tube liner between the crystal pulling zone and the heating element.

The present invention also provides a process for the production of a high purity, semiconductor standard carbon/carbon composite comprising:

heating a carbon fiber reinforcement to at least about 2400° C., impregnating the carbon fiber with a matrix precursor of high purity (semiconductor quality) carbon, carbonizing the impregnated fabric to form a carbonized part, densifying the carbonized part with high purity carbon to form a component, and heating the component at a temperature of at least about 2400° C. to form a heat treated component, and heating the heat treated component at a temperature of at least about 2400° C. in a halogen atmosphere to form the high purity composite.

In one embodiment, densifying the carbonized part includes purging a CVD processing furnace with an inert gas at a temperature of at least about 2400° C., and densifying the carbonized part with CVD carbon in the purged CVD furnace to form the component.

I have therefore found that it is possible to produce carbon/carbon materials with the desired mechanical, thermal, chemical and physical characteristics that make these materials very suitable for use in the semiconductor electronics industry, and particularly for use as semiconductor processing furnace, such as crystal growing reactor, furniture and components

BRIEF DESCRIPTION OF THE DRAWINGS

FIG. 2 is a perspective view of a furnace heat shield, or furnace tube liner.

FIG. 7 is a perspective view of a high purity composite crucible susceptor.

FIG. 10 is a perspective view of an alternate high purity composite crucible susceptor.

DETAILED DESCRIPTION OF THE INVENTION

Figure 1:
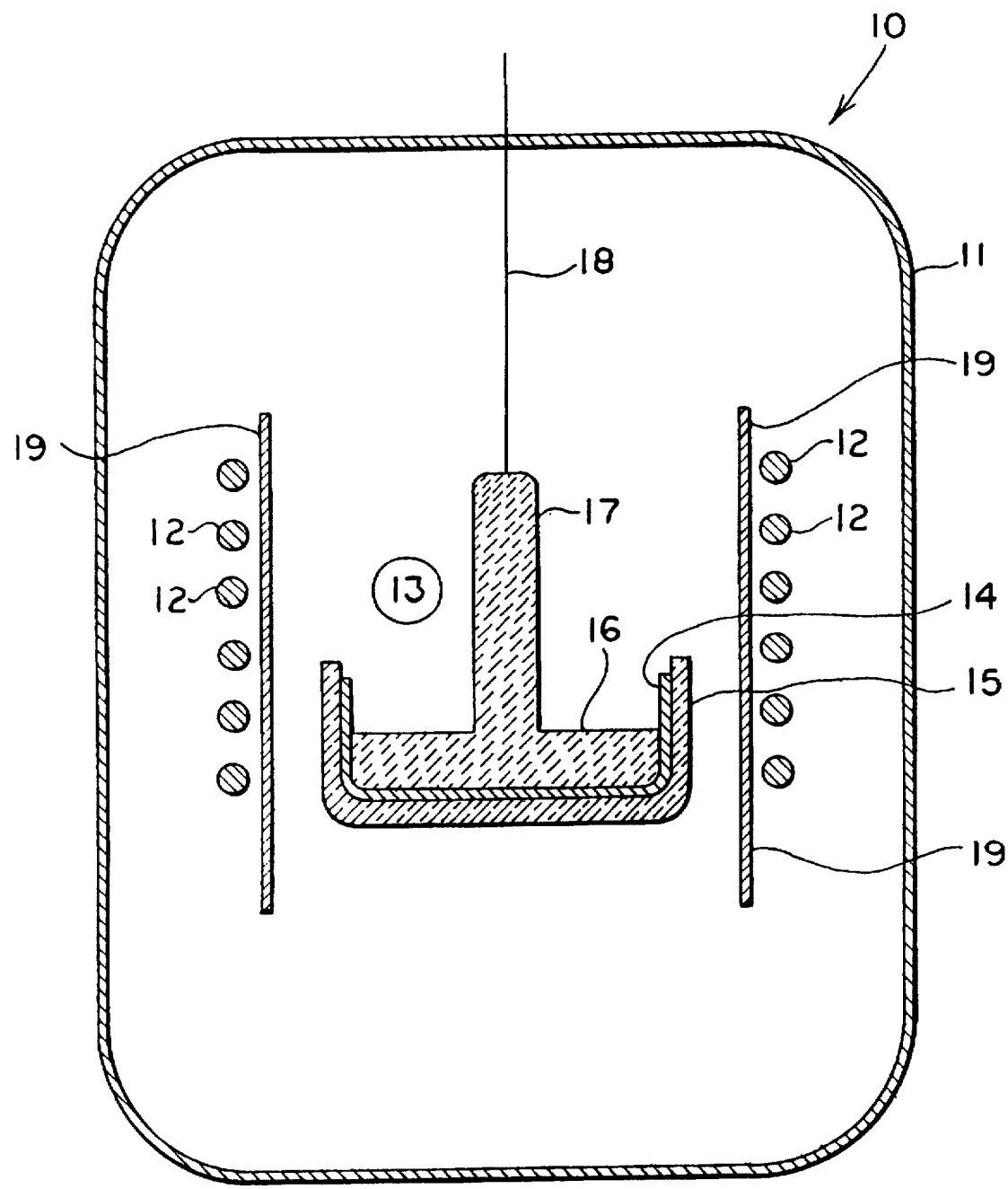
FIGS. 1 and 1A are a schematic cross sectional views of semiconductor processing furnaces, specifically Czochralski crystal growing reactors.

Carbon fiber reinforced carbon matrix materials, or carbon/carbon composites, have thermal stability, high resistance to thermal shock due to high thermal conductivity and low thermal expansion behavior (that is, thermal expansion coefficient or TEC), and have high toughness, strength and stiffness in high-temperature applications. Carbon/carbon composites comprise carbon reinforcements mixed or contacted with matrix precursors to form a "green" composite, which is then carbonized to form the carbon/carbon composite. They may also comprise carbon reinforcements in which the matrix is introduced fully or in part by chemical vapor infiltration.

The carbon reinforcements are commercially available from Amoco, DuPont, Hercules, Celanese and others, and can take the form of fiber, chopped fiber, cloth or fabric, chopped cloth or fabric (referred to as moulding compounds), yarn, chopped yarn, and tape (unidirectional arrays of fibers). Yarns may be woven in desired shapes by braiding or by multidirectional weaving. The yarn, cloth and/or tape may be wrapped or wound around a mandrel to form a variety of shapes and reinforcement orientations. The fibers may be wrapped in the dry state or they may be impregnated with the desired matrix precursor prior to wrapping, winding, or stacking. Such prepreg and woven structures reinforcements are commercially available from BP Chemicals (Hitco) Inc. The reinforcements are prepared from precursors such as polyacrylonitrile (PAN), rayon or pitch. According to a preferred embodiment of the present invention, the reinforcement is in the form of woven cloth.

Matrix precursors which may be used to form carbon/carbon composites according to the present invention include liquid sources of high purity (that is, semiconductor quality) carbon, such as phenolic resins and pitch, and gaseous sources, including hydrocarbons such as methane, ethane, propane and the like. Representative phenolics include, but are not limited to, phenolics sold under the trade designations USP 39 and 91LD, such as supplied by Stuart Ironsides, of Willowbrook, Ill.

The carbon/carbon composites useful in the present invention may be fabricated by a variety of techniques. Conventionally, resin impregnated carbon fibers are autoclave-or press-molded into the desired shape on a tool or in a die. The molded parts are heat-treated in an inert environment to temperatures from about 700° C. to about 2900° C. in order to convert the organic phases to carbon. The carbonized parts are then densified by carbon chemical vapor impregnation or by multiple cycle reimpregnations with the resins described above. Other fabrication methods include hot-pressing and the chemical vapor impregnation of dry preforms. Methods of fabrication of carbon/carbon composites which may be used according to the present invention are described in U.S. Pat. No. 3,174,895 and 3,462,289, which are incorporated by reference herein.

Shaped carbon/carbon composite parts for semiconductor processing components can be made either integrally before or after carbonization, or can be made of sections of material joined into the required shape, again either before or after carbonization.

Once the general shape of the carbon/carbon composite article is fabricated, the piece can be readily machined to precise tolerances, on the order of about 0.1 mm or less. Further, because of the strength and machinability of carbon/carbon composites, in addition to the shaping possible in the initial fabrication process, carbon/carbon composites can be formed into shapes for components that are not possible with graphite.

The high purity carbon/carbon composite according to the present invention has the properties of conventionally produced carbon/carbon composites, yet has improved purity resulting from the process for the production of a semiconductor standard composite of the present invention.

According to the inventive process, fiber (reinforcement) purity is enhanced by the carbon fiber reinforcement, preferably in the form of woven fabric, being heat treated in a non-oxidizing (inert) atmosphere to a temperature of about 2400° C. (43500 F.) to about 3000° C. to remove impurities. This heat treatment further sets the reinforcements, avoiding shrinkage in later procedures.

Carbon matrix purity is enhanced by the utilization of high purity matrix precursors in the impregnation of the heat treated carbon reinforcement. The purity level of the carbon sources should be less than about 50 ppm metals. For example, the phenolic resins should contain less than about 50 ppm metals, should utilize non-metallic accelerators for cure, and preferably should be made in a stainless steel reactor.

The impregnated reinforcements, or prepregs, are staged, laid-up, cured and carbonized (or pyrolized) conventionally, except that processing conditions are maintained at semiconductor standards. The carbonized part is then densified by chemical vapor impregnation or liquid pressure impregnation, using the carbon source materials mentioned above.

In the chemical vapor deposition (CVD) densification of the carbonized part, precautions are taken not to introduce any elemental impurities in the CVD furnace. Prior to processing the carbonized parts, the furnace is purged by running an inert gas, such as argon, helium or nitrogen, through it for several heat treat cycles at about 2400° C. to about 3000° C.

After the component has been formed by the densification of the carbonized part, the component is further heat treated at 2400° C. to about 3000° C. in a non-oxidizing or inert atmosphere to ensure graphitization of the structure and to remove any impurities that may have been introduced. The period of time for this procedure is calculated based upon graphitization time/temperature kinetics, taking into account furnace thermal load and mass. The component may be machined, if desired, to precise specifications and tolerances, as discussed above.

In a further purification procedure, the heat treated components are further heat treated at 2400° C. to about 3000° C. in a halogen atmosphere to remove any remaining metallic elements as the corresponding volatile halides. Suitable halogens include chlorine, bromine and iodine, with chlorine being preferred. The purification treatment may be terminated when no metallic species are detected in the off-gas.

Throughout the production process, great care is taken not to contaminate any parts. As discussed above, processing is done to semiconductor standards, including the use of laminar air flow in work areas which ensure ISO 1000 conditions.

High purity carbon/carbon composites prepared according to the present invention were analyzed by inductively coupled plasma spectroscopy (ICP) in comparison with conventional graphite components, the latter of which was also analyzed by atomic absorption spectroscopy (AAS), and the results are shown in Table I below.

TABLE I

| Element (ppm) | Graphite (1) | Detection Limit (2) | High Purity C/C Level (2) |
|---|---|---|---|
| Aluminum | <0.08 | 0.1 | ND |
| Calcium | 0.13 | 0.1 | ND |
| Chromium | <0.07 | 0.01 | ND |
| Copper | <0.08 | 0.02 | ND |
| Iron | 0.09 | 0.04 | 0.18 |
| Magnesium | <0.02 | 0.02 | ND |
| Manganese | <0.08 | 0.01 | ND |
| Nickel | <0.10 | 0.04 | ND |
| Potassium | <0.10 | 4 | ND |
| Sodium | <0.05 | 0.2 | ND |
| Vanadium | <0.07 | 0.02 | .24 |

(1) by ICP, AAS
(2) by ICP
ND — Not Detected

High purity carbon/carbon composites prepared according to the present invention were analyzed by inductively coupled plasma spectroscopy in comparison with conventional carbon/carbon composites, the latter of which was analyzed by high temperature halonization, and the results are shown in Table II below.

TABLE II

| Element (ppm) | Conventional C/C (1) | Detection Limit (2) | High Purity C/C Level (2) |
|---|---|---|---|
| Aluminum | 4 | 0.1 | ND |
| Calcium | 10–30 | 0.1 | ND |
| Chromium | <0.32 | 0.01 | ND |
| Copper | <0.06 | 0.02 | ND |
| Iron | 3–5 | 0.04 | 0.18 |
| Magnesium | 3–5 | 0.02 | ND |
| Manganese | 0.034 | 0.01 | ND |
| Molybdenum | 1 | 0.02 | ND |
| Nickel | ND | 0.04 | ND |
| Phosphorous | 5.8 | 0.02 | ND |
| Potassium | ND | 4 | ND |
| Sodium | 4.8 | 0.2 | ND |

(1) by High Temperature Halonization
(2) by Inductively Coupled Plasma Spectroscopy (ICP)
ND = Not Detected As shown in Tables I and II, the high purity carbon/carbon composites of the present invention are below the detection limit for inductively coupled plasma spectroscopy analysis for the metals Al, Ca, Cr, Cu, K, Mg, Mn, Mo, Na, Ni, and P, while these metal impurities are shown to be present in graphite, and in conventional carbon/carbon composite materials (except in the latter, for nickel and potassium).

Carbon/carbon composites produced according to the invention were ashed and the diluted residue further analyzed by inductively coupled plasma spectroscopy for metals content in addition to those metals tested above. As demonstrated in Table III below, the concentration of these metals, Ag, Ba, Be, Cd, Co, Pb, Sr, and Zn, was also below the detection limit for the analytical technique.

TABLE III

| ELEMENT | DETECTION LIMIT (PPM) | HIGH PURITY C/C LEVEL |
|---|---|---|
| Barium | 0.01 | ND |
| Beryllium | 0.01 | ND |
| Cadmium | 0.01 | ND |
| Cobalt | 0.02 | ND |

TABLE III-continued

| ELEMENT | DETECTION LIMIT (PPM) | HIGH PURITY C/C LEVEL |
|---|---|---|
| Lead | 0.2 | ND |
| Silver | 0.02 | ND |
| Strontium | 0.02 | ND |
| Zinc | 0.02 | ND |

ND = Not Detected

Carbon/carbon composites, according to the invention, can be used in semiconductor processing without first coating the component, although it is preferable to precoat the carbon/carbon composite prior to use, in order to lock down any particles which may have formed as a result of the composite fabrication or machining process. A coating may be desired in the event of a change in the process furnace atmosphere. Carbon/carbon composites can readily be coated with a protective refractory coating, such as refractory carbides, refractory nitrides, and, particularly with regard to the production of gallium arsenide crystals, refractory borides. Preferred refractory coatings are silicon carbide, silicon nitride, boron nitride, pyrolytic boron nitride and silicon boride. Graded or layered coatings of the carbides, nitrides and borides may also be used.

Advantages of carbon/carbon (C/C) composites over graphite, particularly with regard to semiconductor processing such as in the semiconductor crystal growing process furnace, arise from improved mechanical properties, namely improved strength, dimensional stability, and impact and thermal shock resistance, in part due to the incorporation of the reinforcement fibers. Representative graphite components and carbon/carbon composite components prepared according to the present invention were tested for physical, thermal and mechanical properties, the results for which are reported in Table IV.

TABLE IV

|  | Graphite | C/C Composite |
|---|---|---|
| Physical Property | | |
| Density (g/cc) | 1.72–1.90 | 1.64–1.69 |
| Porosity (%) | 9–12 | 2–15 |
| Hardness (Shore) | 12–80 | Off Scale |
| Thermal Property | | |
| Conductivity (W/mK) | 70–130 | 100 |
| TEC ($\times 10^{-6}$ in/in/°C.) | 2.0–3.6 | 1.4 (in plane) 6.3 (x-ply) |
| Emissivity | 0.77 | 0.52 |
| Mechanical Property | | |
| Ultimate Tensile Strength (ksi) | 0.9–1.7 | 35–50 |
| Tensile Modulus (msi) | 0.8–1.7 | 3.5–16 |
| Flexural Strength (ksi) | 1.7–13 | 16–42 |
| Compressive Strength (ksi) | 4.4–22 | 11–30 |
| Fracture Toughness (Izod Impact ft-lb/in) | <1 | 13 |

Although the properties in Table IV above were tested for composites produced according to a preferred embodiment of the invention, the high purity, semiconductor standard carbon/carbon composites of the present invention can be produced to exhibit a density of about 1.6 to about 2 g/cc, and a porosity of about 2 to about 25%. These high purity composites generally range in tensile strength from about 25 to about 100 ksi, in tensile modulus from about 3 to about 30 msi, in flexural strength from about 15 to about 60 ksi, in compressive strength from about 10 to about 50 ksi, and in fractural toughness as measured by Izod impact, about 5 to about 25 ft-lb/in.

Such inventive high purity composites exhibit a thermal conductivity of about 20 to about 500 W/mK in plane and about 5 to about 200 W/mK cross-ply, thermal expansion coefficients of zero to about $2\times10^{-6}$ in/in/°C. in plane and about $6\times10^{-6}$ in/in/°C. to about $10\times10^{-6}$ in/in/°C. cross ply. Thermal emissivity of the high purity composites is about 0.4 to about 0.8. The electrical resistivity of the high purity composites is about $1\times10^{4}$ to about $1\times10^{-2}$ ohm-cm.

According to the present invention, the high purity, semiconductor standard carbon/carbon composites are formed into components for use in semiconductor processing, such as furnace heat shields, furnace tube liners, and crucible susceptors. These components are useful in the Czochralski crystal growing furnace for producing semiconductor crystals or ingots of silicon, as well as other semiconductor materials such as gallium arsenide.

According to the invention therefore, Czochralski process furnace components such as heat shields and crucible susceptors have been fabricated, comprising a high purity, semiconductor standard composite including a carbon fiber reinforced carbon matrix having a level of metal impurity below the detection limit of inductively coupled spectroscopy for the metals Ag, Al, Ba, Be, Ca, Cd, Co, Cr, Cu, K, Mg, Mn, Mo, Na, Ni, P, Pb, Sr and Zn.

The high purity carbon/carbon composite susceptors have been used in the Czochralski crystal growing process for pulling a silicon ingot from a silicon melt. In this process, the silicon melt was formed in a quartz crucible, which was intimately supported within the furnace by the susceptor. Also, a high purity carbon/carbon composite furnace heat shield was disposed between the crucible containing the silicon melt and the furnace heating elements.

Figure 1A:
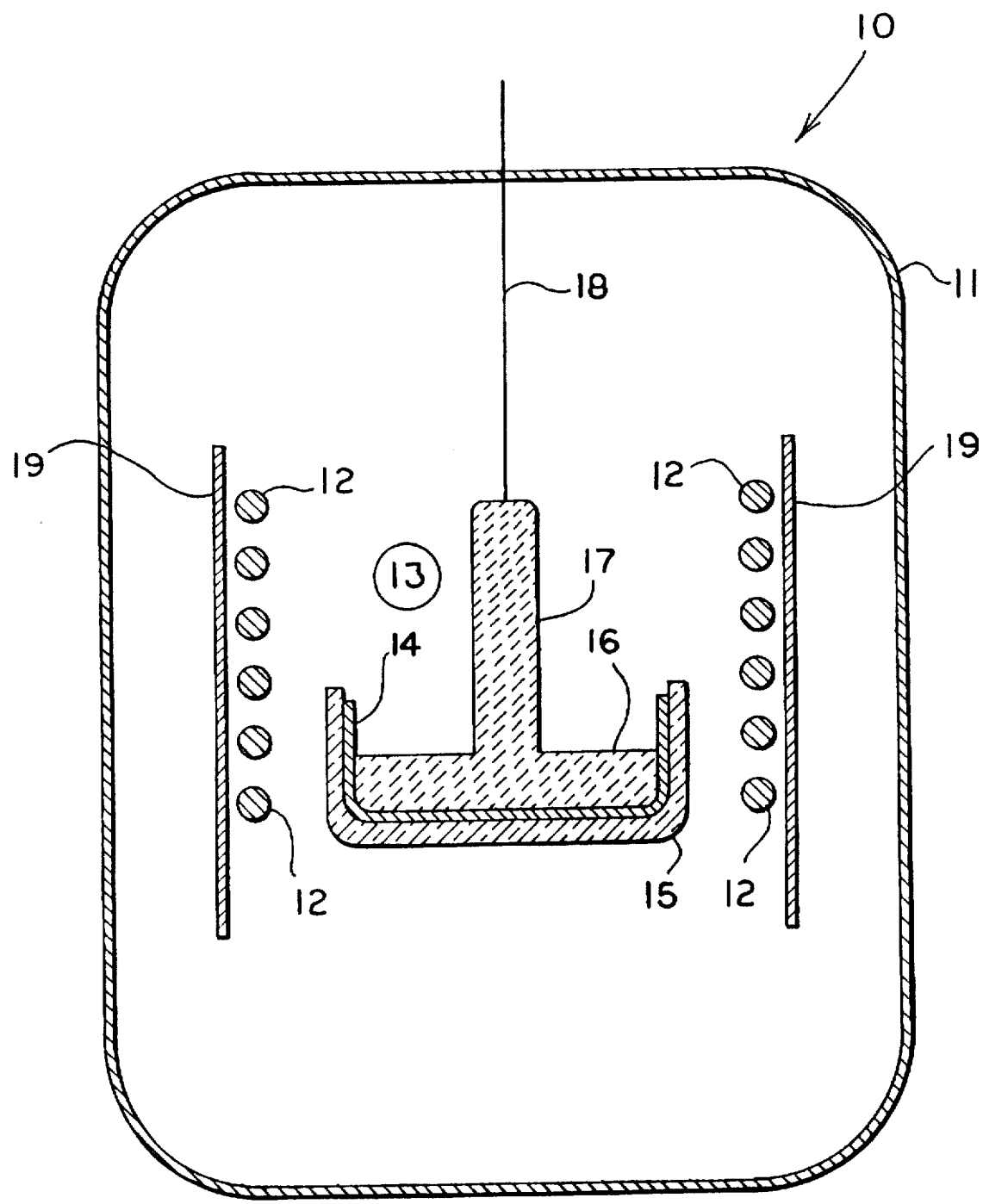

As shown in the sectional schematic of FIGS. 1 and 1A, a typical Czochralski semiconductor processing reactor comprises a furnace 10 having a water jacketed stainless steel wall 11 to enclose the processing area. Insulation, not shown, protects the wall from the internal heating elements 12. Disposed radially inwardly of the heating elements 12 is the crystal- or ingot-pulling zone 13, where the semiconductor material is melted and processed.

Within the crystal pulling zone 13, a crucible 14, suitably made of quartz, is intimately supported by the high purity composite crucible susceptor 15 which rests either on a refractory hot surface, insulation, an axle for rotation of the crucible susceptor 15, or another furnace component (not shown). The semiconductor material is heated within the crucible 14 to form a melt 16, from which a crystal or ingot 17 is drawn by conventional crystal drawing means 18, such as a weighted pulley. The semiconductor material is highly pure, electronic quality silicon or gallium arsenide. The crystal pulling zone 13 may be maintained at a subatmospheric pressure, by means for evacuating the furnace (not shown).

As shown in FIG. 1, the heating elements 12 and the crystal pulling zone 13 is disposed a furnace heat shield or furnace tube liner 19, comprising the high purity composite. The crucible susceptor 15, and particularly the heat shield or tube liner 19, protect the crystal pulling zone 13 and the melt 16 and crystal 17 contained therein from potentially contaminating elements.

These high purity composite components provide a stable thermal environment in which the solidification of the crystal or ingot 17 is permitted to proceed without non-uniformity causing thermal excursions. The heat shield 19 as shown in FIG. 1, helps to maintain the crystal pulling zone 13 at an optimum temperature for the semiconductor material being processed such as about 1450° C. for silicon, even though the outer surface of the shield, exposed to the heating elements 12, may experience a much higher temperature such as 1500° C. to 2000° C. The crucible susceptor 15 intimately supports the crucible 14, which may soften and begin to "flow" at operating temperatures. The susceptor 15 maintains the structural integrity of the crucible 14 during operation.

As shown in FIG. 1A, in a smaller furnace design the heat shield 19 can be disposed radially outside of a configuration comprising a crucible 14 within a susceptor 16 in close proximity to the heating elements 12 in order to contain heat within the crystal pulling zone 13 and prevent its dissipation radially.

The high purity composites are also resistant to thermal shock and heat/cool cycles, offering an improvement over conventional graphite components. Other advantageous thermal characteristics are listed in Table IV, above.

Figure 3:
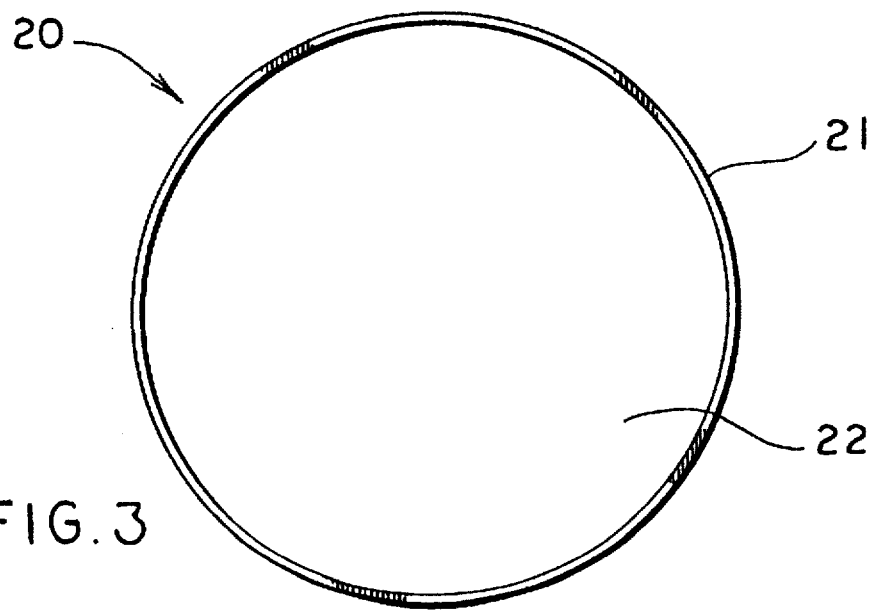
FIG. 3 is a plan view of a furnace heat shield, or furnace tube liner.
Figure 4:
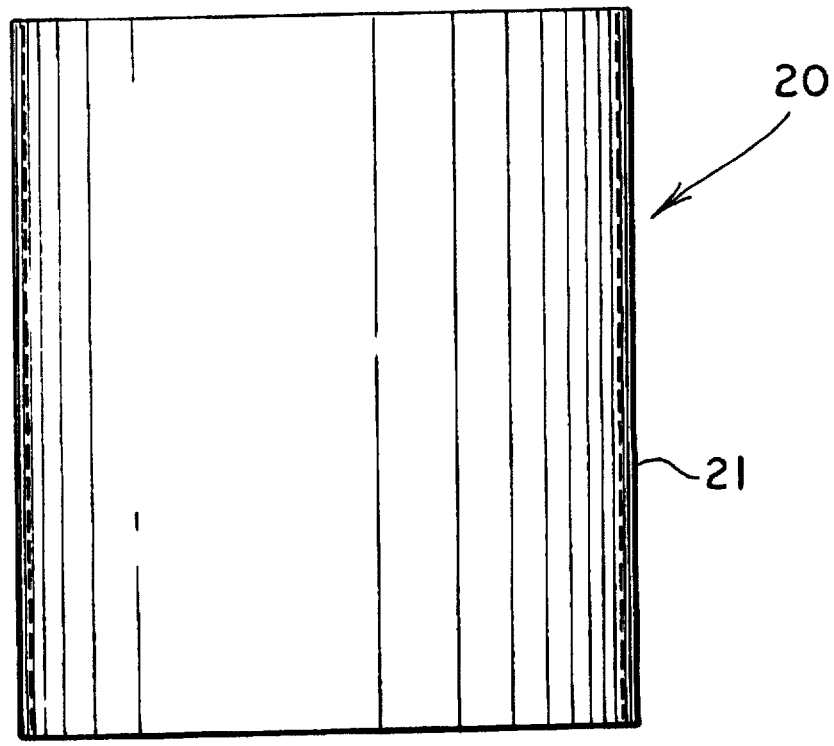
FIG. 4 is an elevational view of a furnace heat shield, or furnace tube liner.

As shown in FIGS. 2, 3 and 4, the furnace heat shield or furnace tube liner 20 can be a generally cylindrical shape, although not being limited to that configuration, having a high purity composite wall 21 defining an internal opening 22. The crystal pulling zone 13 can be contained within the opening 22.

Figure 5:
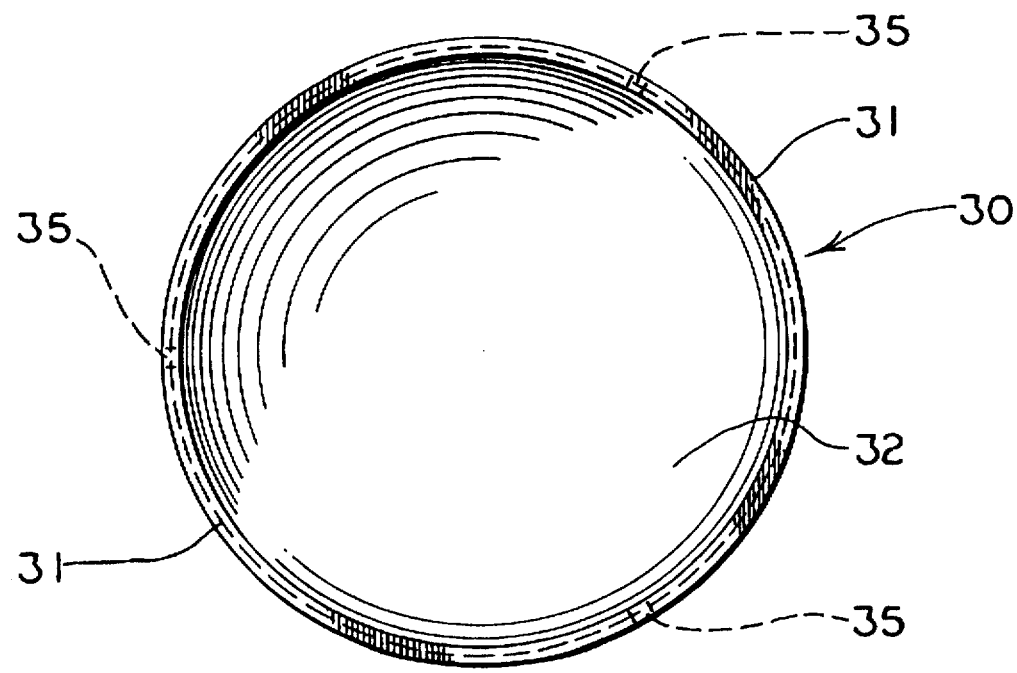
FIG. 5 is a plan view of a high purity composite crucible susceptor.
Figure 6:
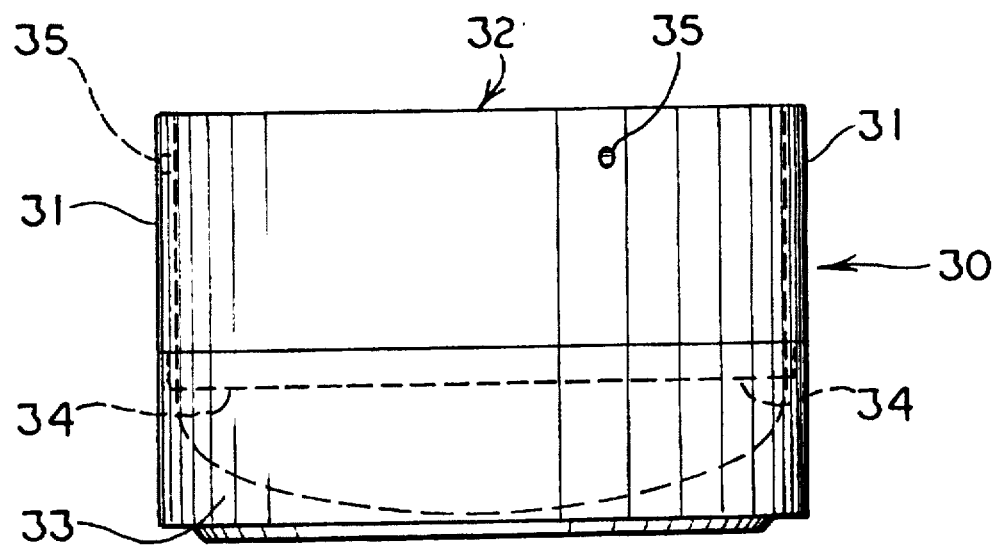
FIG. 6 is an elevational view of a high purity composite crucible susceptor.

As shown in FIGS. 5, 6 and 7, the crucible susceptor 30 has a high purity composite side wall 31, a top opening 32 and a high purity composite base 33. The interior of the crucible susceptor 30 is shaped to hold the particular crucible design for which it was intended, and thus the base 33 can be scooped in the form of a bowl, and the side wall 31 can contain a ridge 34 such as for nesting the crucible. The side wall 31 may contain fixturing holes 35 for mounting the susceptor 30.

Figure 8:
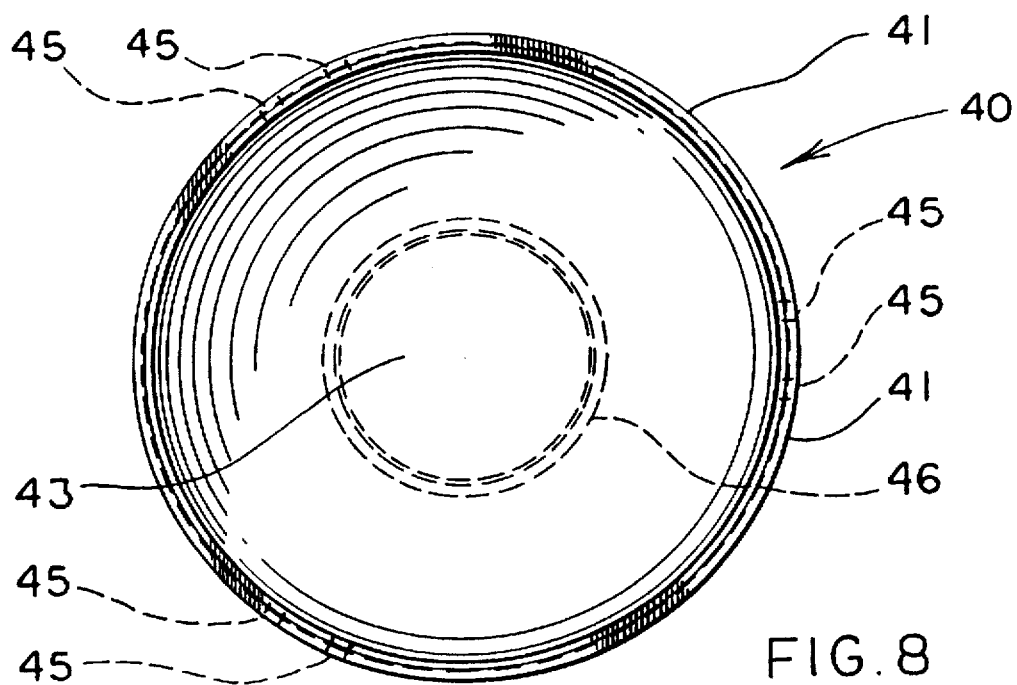
FIG. 8 is a plan view of an alternate high purity composite crucible susceptor.
Figure 9:
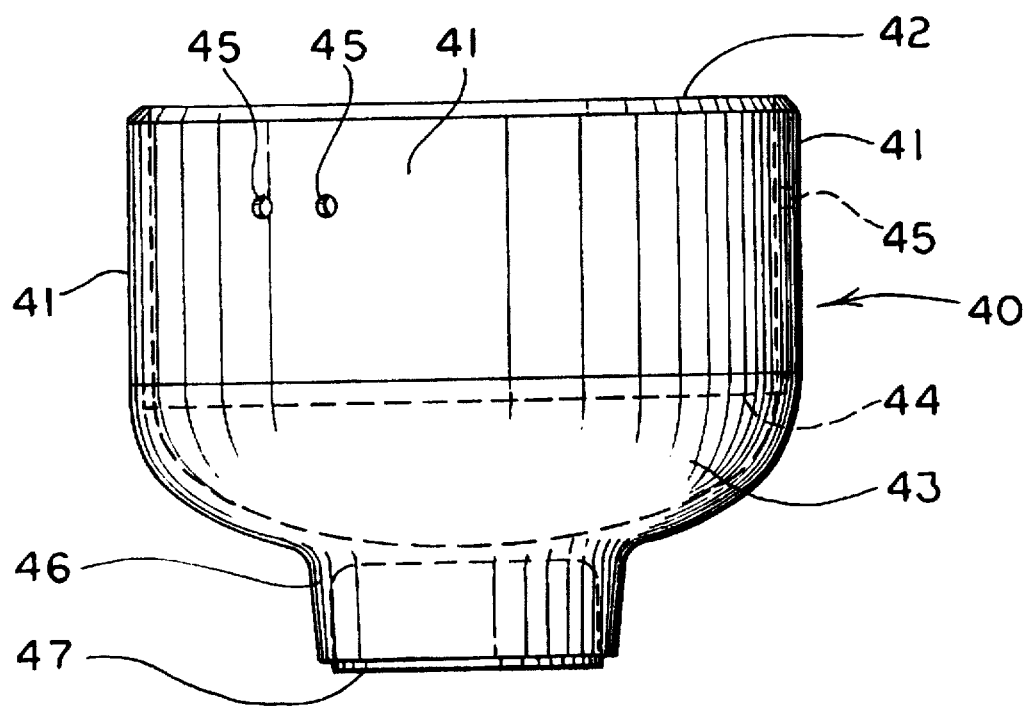
FIG. 9 is an elevational view of an alternate high purity composite crucible susceptor.

In an alternative embodiment shown in FIGS. 8, 9 and 10, the crucible susceptor 40 also has a high purity composite side wall 41, a top opening 42 and a high purity composite base 43. The base 43 may also be scooped, and the side wall 41 can contain one or more ridges 44. Fixturing holes 45 may be present in the side wall 41. The base 43 can contain a high purity composite fitting 46 which defines an engagement zone 47 that may engage an axle for rotating the crucible/crucible susceptor assembly, an exhaust tubing for lowering the pressure of the furnace interior, or another furnace component. The ease of fabrication of the high purity carbon/carbon composite materials prior to carbonization, and their machinability after carbonization, permits the fabricating the furnace components into any desired configuration.

The following advantages have been realized using the high purity composite components of the present invention in the CZ crystal growing apparatus. The improved durability of the high purity carbon/carbon composite components results in a reduction in furnace downtime. The typical lifetime for graphite components in the CZ semiconductor crystal growing industry is three to four months, while for the high purity composite components, a lifetime of 12 to 15 months can be realized, based on an extrapolation of real time in-situ testing.

The durability of the high purity carbon/carbon composite components is due to their superior thermal and mechanical properties. In addition, the affinity of silicon oxides for the high purity composite material is substantially less than that of graphite, which reduces the need for periodic cleaning and replacement.

The improved purity of the high purity carbon/carbon composite components over graphite results in a reduced level of contamination of the silicon ingots and wafers. This is evidenced by the time taken for an electrical current to flow between contaminating atoms (the Hall Mobility). The shorter the time for the current to flow between the contaminating atoms, the more "impure" the silicon wafer is.

Electrical breakdown times for silicon wafers produced from furnaces employing graphite and high purity carbon/carbon composite components were tested. Electrical breakdown times for silicon wafers produced from furnaces utilizing graphite components ranged from 200 to 250 microseconds. The wafers produced by the high purity carbon/carbon composite component-utilizing furnaces are considerably purer, exhibiting electrical breakdown times of greater than 300 microseconds. This improvement is highly significant to the semiconductor industry.

In another measurement of impurity concentrations in graphite and the inventive material, impurity transfer into silicon was measured by direct contact at 550° C. over a period of 12 hours. It was determined that the elemental impurities listed in Tables I and II were lower in the inventive material than in graphite by a factor of at least one hundred (100).

The use of high purity carbon/carbon composite components in the CZ crystal growing reactor results in significant improvements in the yield of silicon wafers that are classified as "good for structure". The yield of "good for structure" wafers produced with graphite furnace components was 68%, while the yield of "good for structure" wafers produced with high purity carbon/carbon composite furnace components was 72%. It should be noted that in the silicon semiconductor wafer manufacturing industry, a 1% increase in yield is regarded as extremely financially significant. This difference in good for structure yield may be attributable to the superior control of thermal conductivity throughout the high purity carbon/carbon composite components over time. Very little degradation of thermal properties of the inventive materials were observed.

An additional and unexpected benefit from the use of the high purity carbon/carbon composite components over graphite concerned the production of large components. The fabrication of large graphite parts is difficult due to graphite's low mechanical properties and graphite's inability to support its own weight. On the other hand large parts were able to be made from high purity carbon/carbon composites with ease, for example, up to 48 inches in diameter.

Regarding power consumption, the electrical power required by a CZ furnace equipped with high purity carbon/carbon composite components was significantly less than that of a similar furnace equipped with conventional graphite parts. This is due to the superior thermal characteristics of the high purity carbon/carbon composite components, as shown above. Furnaces utilizing the high purity composite furnace tube liner experienced a 2% to 5% decrease in the amount of power required, depending upon the number of components in the furnace. This power savings is very significant, in terms of capital requirements as well as operating costs.

Regarding particulation, high purity carbon/carbon composite components exhibited outstanding resistance to the generation of dust particles relative to conventional graphite, which is described by those skilled in the art as mealy. The contamination of silicon wafers produced in furnaces with high purity carbon/carbon composite components is substantially lessened, as compared to those produced with graphite components.

Therefore, the objects of the present invention are accomplished by the production and use of high purity carbon/carbon composite components for use in semiconductor processing. The mechanical and purity advantages of the inventive material with respect to graphite, and the purity advantages of the inventive material with respect to graphite and conventional carbon/carbon composites has been demonstrated, as is shown above. It should be understood that the present invention is not limited to the specific embodiments described above, but includes the variations, modifications and equivalent embodiments that are defined by the following claims.

I claim:

1. A semiconductor crystal growing apparatus comprising at least one high purity, carbon/carbon composite component, said high purity composite including a carbon fiber reinforced carbon matrix having a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn;
   wherein the carbon fiber is selected from the group consisting of fiber, cloth, woven fabric, yarn and tape;
   the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

2. The apparatus of claim 1 further comprising at least one heating element and a crystal growing zone for drawing a semiconductor crystal from a semiconductor material melt, wherein said high purity composite component is a heat shield disposed between said at least one heating element and said crystal growing zone.

3. The apparatus of claim 1 further comprising at least one heating element and a crystal growing zone for drawing a semiconductor crystal from a semiconductor material melt, wherein said melt is contained in a crucible within the crystal growing zone and said high purity composite component is a crucible susceptor intimately supporting said crucible.

4. The apparatus of claim 1 further comprising at least one heating element and a crystal growing zone for drawing a semiconductor crystal from a semiconductor material melt, said melt contained in a crucible within the crystal growing zone, wherein at least one said high purity composite component is a heat shield disposed between said at least one heating element and said crystal growing zone and at least a second said high purity composite component is a crucible susceptor intimately supporting said crucible.

5. The apparatus of claim 1 further comprising at least one heating element in thermal proximity to a crystal growing zone for drawing a semiconductor crystal from a semiconductor material melt, wherein said high purity composite component is a heat shield disposed radially outwardly of said at least one heating element and said crystal growing zone.

6. The apparatus of claim 1 further comprising at least one heating element in thermal proximity to a crystal growing zone for drawing a semiconductor crystal from a semiconductor material melt, said melt contained in a crucible within the crystal growing zone, wherein at least one said high purity composite component is a heat shield disposed radially outwardly of said at least one heating element and said crystal growing zone and at least a second said high purity composite component is a crucible susceptor intimately supporting said crucible.

7. A Czochralski crystal growing process for pulling a semiconductor ingot from a semiconductor material melt, including:
   providing the semiconductor material melt in a quartz crucible, and,
   intimately supporting the crucible with a crucible susceptor comprising a high purity semiconductor standard composite of carbon fiber reinforced carbon matrix having a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn;
   wherein the carbon fiber is selected from the group consisting of fiber, cloth, woven fabric, yarn, and tape;
   the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

8. The process of claim 7, wherein the semiconductor ingot is a silicon ingot, including cutting the silicon ingot into silicon wafers, and further including providing said silicon wafers with an electrical breakdown time of greater than 300 microseconds.

9. The process of claim 7, wherein the semiconductor is selected from the group consisting of silicon and gallium arsenide.

10. A Czochralski crystal growing process for pulling a semiconductor ingot from a semiconductor material melt, including:
   providing the semiconductor material melt in a crystal pulling zone disposed in thermal contact with at least one heating element, and, disposing radially outwardly of said crystal pulling zone and said at least one heating element, a heat shield comprising a high purity, semiconductor standard composite of carbon fiber reinforced carbon matrix having a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn;
   wherein the carbon fiber is selected from the group consisting of fiber, cloth, woven fabric, yarn, and tape;
   the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

11. The process of claim 10, wherein the semiconductor ingot is a silicon ingot, including cutting the silicon ingot into silicon wafers, and further including providing said silicon wafers with an electrical breakdown time of greater than 300 microseconds.

12. The process of claim 10, wherein the semiconductor is selected from the group consisting of silicon and gallium arsenide.

13. A Czochralski crystal growing process for pulling a semiconductor ingot from a semiconductor material melt, including providing the semiconductor material melt in a quartz crucible, wherein the quartz crucible is isolated from contaminant sources by at least one high purity, carbon/carbon composite component comprising a high purity, semiconductor standard composite of carbon fiber reinforced carbon matrix having a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn;
   wherein the carbon fiber is selected from the group consisting of fiber, cloth, woven fabric, yarn, and tape;
   the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

14. The process as in claim 13, wherein the component is selected from the group consisting of crucible susceptor, furnace heat shield and furnace tube liner.

15. The process of claim 14, wherein the semiconductor is selected from the group consisting of silicon and gallium arsenide.

16. The process of claim 15, wherein the component includes at least one said crucible susceptor and at least one of said furnace heat shield and said furnace tube liner.

17. A high purity composite comprising a carbon fiber reinforced carbon matrix having a level of total metal impurity less than about 5 parts per million for the metals Ag, Al, Ba, Be, Ca, Cd, Co, Cr, Cu, Fe, K, Mg, Mn, Mo, Na, Ni, P, Pb, Sr, V and Zn;
   wherein the carbon fiber is selected from the group consisting of fiber, cloth, woven fabric, yarn, and tape;
   the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

18. The high purity composite of claim 17 wherein the carbon fiber is woven fabric.

19. The high purity composite of claim 17 wherein the carbon matrix comprises carbonized high purity carbon matrix precursors, wherein the precursor contains less than about 50 ppm metals.

20. The high purity composite of claim 19 wherein the carbon matrix precursor was a gaseous hydrocarbon.

21. The high purity composite of claim 17 wherein the carbon matrix comprises carbonized high purity phenolic resin.

22. The high purity composite of claim 17 wherein the carbon matrix comprises carbonized high purity pitch.

23. The high purity composite of claim 17 having an ultimate tensile strength of about 35 to about 50 ksi and a tensile modulus of about 3.5 to about 16 msi.

24. The high purity composite of claim 17 having a flexural strength of about 16 to about 42 ksi and a compressive strength of about 11 to about 30 ksi.

25. The high purity composite of claim 17 having a fracture toughness as measured by Izod impact of about 5 to about 25 ft lb/in.

26. The high purity composite of claim 17 having an in plane thermal expansion coefficient of zero to about $2 \times 10^6$ and a cross-ply thermal expansion coefficient of about 6 to about $10 \times 10^6$.

27. The high purity composite of claim 17 having an in-plane thermal conductivity of about 20 to about 500 W/mK and a cross-ply thermal conductivity of about 5 to about 200 W/mK.

28. The high purity composite of claim 17 having a thermal emissivity of about 0.4 to about 0.8.

29. The high purity composite of claim 17 having a refractory coating selected from the group consisting of carbides, nitrides, and borides.

30. The high purity composite of claim 17 having a refractory coating of silicon carbide.

31. The high purity composite of claim 17 having an electrical resistivity of about $1 \times 10^{-4}$ to about $1 \times 10^{-2}$ ohm-cm.

32. The high purity composite of claim 17 containing about 0.18 ppm iron or less.

33. The high purity composite of claim 17 containing about 0.24 ppm vanadium or less.

34. A Czochralski process furnace component comprising a high purity, semiconductor standard composite comprising the carbon fiber reinforced carbon matrix of any of claims 17 through 33.

35. The furnace component of claim 34 selected from the group consisting of crucible susceptor, furnace heat shield and furnace tube liner.

36. A semiconductor crystal growing apparatus comprising at least one high purity, carbon/carbon composite component, said high purity composite including a carbon fiber reinforced carbon matrix having a level of total metal impurity of less than about 5 parts per million for the metals Ag, Al, Ba, Be, Ca, Cd, Co, Cr, Cu, Fe, K, Mg, Mn, Mo, Na, Ni, P, Pb, Sr, V and Zn;
   wherein the carbon fiber is selected from the group consisting of fiber, cloth, woven fabric, yarn and tape;
   the high purity composite having an ultimate tensile strength of about 25 to about 100 ksi and a tensile modulus of about 3 to about 30 msi, and having a flexural strength of about 15 to about 60 ksi and a compressive strength of about 10to about 50 ksi.

37. The apparatus of claim 36 further comprising at least one heating element and a crystal growing zone for drawing a semiconductor crystal from a semiconductor material melt, wherein said high purity composite component is a heat shield disposed between said at least one heating element and said crystal growing zone.

38. The apparatus of claim 36 further comprising at least one heating element and a crystal growing zone for drawing a semiconductor crystal from a semiconductor material melt, wherein said melt is contained in a crucible within the crystal growing zone and said high purity composite component is a crucible susceptor intimately supporting said crucible.

39. The apparatus of claim 36 further comprising at least one heating element and a crystal growing zone for drawing a semiconductor crystal from a semiconductor material melt, said melt contained in a crucible within the crystal growing zone, wherein at least one said high purity composite component is a heat shield disposed between said at least one heating element and said crystal growing zone and at least a second said high purity composite component is a crucible susceptor intimately supporting said crucible.

40. The apparatus of claim 36 further comprising at least one heating element in thermal proximity to a crystal growing zone for drawing a semiconductor crystal from a semiconductor material melt, wherein said high purity composite component is a heat shield disposed radially outwardly of said at least one heating element and said crystal growing zone.

41. The apparatus of claim 36 further comprising at least one heating element in thermal proximity to a crystal growing zone for drawing a semiconductor crystal from a semiconductor material melt, said melt contained in a crucible within the crystal growing zone, wherein at least one said high purity composite component is a heat shield disposed radially outwardly of said at least one heating element and said crystal growing zone and at least a second said high purity composite component is a crucible susceptor intimately supporting said crucible.

42. A Czochralski crystal growing process for pulling a semiconductor ingot from a semiconductor material melt, including:
   providing the semiconductor material melt in a quartz crucible, and,
   intimately supporting the crucible with a crucible susceptor comprising a high purity, semiconductor standard composite of carbon fiber reinforced carbon matrix having a level of total metal impurity of less than about 5 parts per million for the metals Ag, Al, Ba, Be, Ca, Cd, Co, Cr, Cu, Fe, K, Mg, Mn, Mo, Na, Ni, P, Pb, Sr, V and Zn;

wherein the carbon fiber is selected from the group consisting of fiber, cloth, woven fabric, yarn, and tape;

the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

43. The process of claim 42, wherein the semiconductor ingot is a silicon ingot, including cutting the silicon ingot into silicon wafers, and further including providing said silicon wafers with an electrical breakdown time of greater than 300 microseconds.

44. The process of claim 42, wherein the semiconductor is selected from the group consisting of silicon and gallium arsenide.

45. A Czochralski crystal growing process for pulling a semiconductor ingot from a semiconductor material melt, including:

providing the semiconductor material melt in a crystal pulling zone disposed in thermal contact with at least one heating element, and, disposing radially outwardly of said crystal pulling zone and said at least one heating element, a heat shield comprising a high purity, semiconductor standard composite of carbon fiber reinforced carbon matrix having a level of total metal impurity of less than about 5 parts per million for the metals Ag, Al, Ba, Be, Ca, Cd, Co, Cr, Cu, Fe, K, Mg, Mn, Mo, Na, Ni, P, Pb, Sr, V and Zn;

wherein the carbon fiber is selected from the group consisting of fiber, cloth, woven fabric, yarn, and tape;

the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

46. The process of claim 45, wherein the semiconductor ingot is a silicon ingot, including cutting the silicon ingot into silicon wafers, and further including providing said silicon wafers with an electrical breakdown time of greater than 300 microseconds.

47. The process of claim 45, wherein the semiconductor is selected from the group consisting of silicon and gallium arsenide.

48. A Czochralski crystal growing process for pulling a semiconductor ingot from a semiconductor material melt, including providing the semiconductor material melt in a quartz crucible, wherein the quartz crucible is isolated from contaminant sources by at least one high purity, carbon/carbon composite component comprising a high purity, semiconductor standard composite of carbon fiber reinforced carbon matrix having a level of total metal impurity less than about 5 parts per million for the metals Ag, Al, Ba, Be, Ca, Cd, Co, Cr, Cu, Fe, K, Mg, Mn, Mo, Na, Ni, P, Pb, Sr, V and Zn;

wherein the carbon fiber is selected from the group consisting of fiber, cloth, woven fabric, yarn, and tape;

the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

49. The process as in claim 48, wherein the component is selected from the group consisting of crucible susceptor, furnace heat shield and furnace tube liner.

50. The process of claim 49, wherein the semiconductor is selected from the group consisting of silicon and gallium arsenide.

51. The process of claim 50, wherein the component includes at least one said crucible susceptor and at least one of said furnace heat shield and said furnace tube liner.

52. A Czochralski crystal growing process for pulling a semiconductor ingot from a silicon semiconductor material melt, including providing the semiconductor material melt in a quartz crucible, wherein the quartz crucible is isolated from contaminant sources by at least one high purity, semiconductor standard composite component of carbon fiber reinforced carbon matrix having a level of total metal impurity of less than about 5 parts per million for the metals Ag, Al, Ba, Be, Ca, Cd, Co, Cr, Cu, Fe, K, Mg, Mn, Mo, Na, Ni, P, Pb, Sr, V and Zn capable of providing a yield greater than 68 percent of good-for-structure silicon semiconductor wafers;

wherein the carbon fiber is selected from the group consisting of fiber, cloth, woven fabric, yarn, and tape;

the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

53. The process as in claim 52, wherein the component is selected from the group consisting of crucible susceptor, furnace heat shield and furnace tube liner.

54. A Czochralski process furnace component comprising a high purity, semiconductor standard composite comprising a high purity carbon fiber reinforced carbon matrix having a level of total metal impurity of less than about 5 parts per million for the metals Ag, Al, Ba, Be, Ca, Cd, Co, Cr, Cu, Fe, K, Mg, Mn, Mo, Na, Ni, P, Pb, Sr, V and Zn and exhibiting an impurity transfer of the selected metals Al, Ca, Cr, Cu, Fe, K, Mg, Mn, Mo, Na, Ni, P and V to silicon at 550° C. of less than about one percent the impurity transfer of said selected metals for a corresponding graphite component to silicon;

wherein the carbon fiber is selected from the group consisting of fiber, cloth, woven fabric, yarn, and tape;

the high purity composite having an ultimate tensile strength of about 25 to about 100 ksi and a tensile modulus of about 3 to about 30 msi, and having a flexural strength of about 15 to about 60 ksi and a compressive strength of about 10 to about 50 ksi.

\* \* \* \* \*